(12) United States Patent
Wang

(10) Patent No.: US 10,861,905 B2
(45) Date of Patent: Dec. 8, 2020

(54) PIXEL ARRANGEMENT STRUCTURE AND ORGANIC LIGHT-EMITTING DIODE DISPLAY DEVICE

(71) Applicant: Wuhan China Star Optoelectronics Semiconductor Display Technology Co., Ltd., Wuhan (CN)

(72) Inventor: Zheng Wang, Wuhan (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 78 days.

(21) Appl. No.: 16/323,778

(22) PCT Filed: Dec. 20, 2018

(86) PCT No.: PCT/CN2018/122461
§ 371 (c)(1),
(2) Date: Feb. 7, 2019

(87) PCT Pub. No.: WO2020/098070
PCT Pub. Date: May 22, 2020

(65) Prior Publication Data
US 2020/0203440 A1  Jun. 25, 2020

(30) Foreign Application Priority Data
Nov. 13, 2018  (CN) .......................... 2018 1 1343991

(51) Int. Cl.
*H01L 27/32*   (2006.01)
*G09G 3/3208*  (2016.01)
*H01L 51/50*   (2006.01)

(52) U.S. Cl.
CPC ....... *H01L 27/3218* (2013.01); *G09G 3/3208* (2013.01); *G09G 2300/0465* (2013.01); *G09G 2310/0278* (2013.01)

(58) Field of Classification Search
CPC ... H01L 27/3211–3218; H01L 27/3202; H01L 27/3204; H01L 27/3225–3234;
(Continued)

(56) References Cited

U.S. PATENT DOCUMENTS 4,908,609 A * 3/1990 Stroomer ................. H04N 9/12
                                            345/88
6,714,206 B1 * 3/2004 Martin ................. G09G 3/2003
                                            345/589
(Continued)

FOREIGN PATENT DOCUMENTS

CN  103715227  4/2014
CN  104009063  8/2014
(Continued)

*Primary Examiner* — Maliheh Malek

(57) ABSTRACT

A pixel arrangement structure includes a plurality of pixel rows. Two adjacent ones of the pixel rows are disposed to be misaligned with each other. Each of the pixel rows includes a plurality of pixels. Each of the pixels includes a first sub pixel; a second sub pixel; and a third sub pixel. The first sub pixel in an N+1-th pixel row is disposed adjacent to the first sub pixel of one of the pixels in an N+2-th pixel row, the second sub pixel in an N-th pixel row is disposed adjacent to the second sub pixel of one of the pixels in the N+1-th pixel row, and N is a positive odd number greater than or equal to 1. An organic light-emitting diode display device is further provided.

15 Claims, 2 Drawing Sheets

(58) Field of Classification Search
CPC ... H01L 27/3209; H01L 27/3244–3279; H01L 27/326–3265; H01L 51/0032–0095; H01L 51/50–56; H01L 2251/50–568; H01L 2457/206

See application file for complete search history.

(56) References Cited

U.S. PATENT DOCUMENTS

| | | | |
|---|---|---|---|
| 6,867,549 B2* | 3/2005 | Cok | G09G 3/3216 315/169.3 |
| 7,184,066 B2* | 2/2007 | Elliot | G09G 3/20 345/694 |
| 7,508,126 B2* | 3/2009 | Miyagawa | H01L 27/3218 313/504 |
| 7,916,244 B2* | 3/2011 | Hur | G02F 1/133707 349/106 |
| 8,330,352 B2* | 12/2012 | Sung | G09G 3/3208 313/504 |
| 8,405,692 B2* | 3/2013 | Brown Elliott | G02F 1/133514 345/694 |
| 8,421,820 B2* | 4/2013 | Brown Elliott | G09G 3/20 345/204 |
| 8,576,311 B2* | 11/2013 | Okumura | G09G 3/2003 348/273 |
| 9,647,039 B1* | 5/2017 | Wang | H01L 51/001 |
| 9,653,033 B2* | 5/2017 | Kobayashi | G09G 3/3648 |
| 9,824,646 B2* | 11/2017 | Shimmen | G09G 3/3607 |
| 10,074,670 B2* | 9/2018 | Itou | H01L 27/124 |
| 10,141,380 B2* | 11/2018 | Chung | H01L 27/3276 |
| 10,204,540 B2* | 2/2019 | Chaji | G09G 3/2003 |
| 10,236,326 B2* | 3/2019 | Lee | H01L 27/3218 |
| 10,347,220 B1* | 7/2019 | Jiang | G09G 5/393 |
| 10,504,969 B2* | 12/2019 | Tian | H01L 27/3218 |
| 10,629,656 B2* | 4/2020 | Jo | G09G 3/3225 |
| 10,672,328 B1* | 6/2020 | Wang | G09G 3/32 |
| 10,707,273 B2* | 7/2020 | Madigan | H01L 51/5206 |
| 2002/0070909 A1* | 6/2002 | Asano | H01L 27/326 345/76 |
| 2002/0186214 A1* | 12/2002 | Siwinski | G09G 3/3208 345/212 |
| 2003/0071943 A1* | 4/2003 | Choo | G02F 1/133514 349/106 |
| 2004/0201558 A1* | 10/2004 | Arnold | H01L 27/3213 345/83 |
| 2005/0225575 A1* | 10/2005 | Brown Elliott | G09G 3/20 345/694 |
| 2005/0270444 A1* | 12/2005 | Miller | G09G 3/3225 349/108 |
| 2005/0275769 A1* | 12/2005 | Roh | G02F 1/133514 349/109 |
| 2006/0033422 A1* | 2/2006 | Chao | H01L 27/3216 313/500 |
| 2007/0024183 A1* | 2/2007 | Lih | H01L 51/56 313/504 |
| 2007/0085959 A1* | 4/2007 | Kim | G02F 1/1345 349/143 |
| 2008/0001525 A1* | 1/2008 | Chao | H01L 27/3216 313/500 |
| 2008/0084376 A1* | 4/2008 | Hirota | G09G 3/2003 345/88 |
| 2008/0290794 A1* | 11/2008 | Yuasa | H01L 27/3211 313/504 |
| 2009/0009673 A1* | 1/2009 | Hisada | H01L 27/1255 349/39 |
| 2009/0302331 A1* | 12/2009 | Smith | G09G 3/3208 257/88 |
| 2010/0156279 A1* | 6/2010 | Tamura | H01L 27/3211 313/504 |
| 2011/0025723 A1* | 2/2011 | Kim | H01L 27/3218 345/690 |
| 2011/0157502 A1* | 6/2011 | Qiao | G09G 3/3614 349/37 |
| 2011/0291550 A1* | 12/2011 | Kim | H01L 27/3216 313/504 |
| 2012/0147065 A1* | 6/2012 | Byun | G09G 3/3208 345/690 |
| 2013/0155034 A1* | 6/2013 | Nakayama | G09G 3/3648 345/204 |
| 2015/0048322 A1* | 2/2015 | So | H01L 27/3276 257/40 |
| 2015/0061978 A1 | 3/2015 | Shih et al. | |
| 2015/0137130 A1* | 5/2015 | Wang | G02F 1/136286 257/72 |
| 2015/0187859 A1 | 7/2015 | Choi et al. | |
| 2015/0270317 A1* | 9/2015 | Lee | H01L 27/3218 257/40 |
| 2015/0379924 A1* | 12/2015 | Matsueda | H01L 27/3218 345/690 |
| 2016/0027376 A1 | 1/2016 | Chen | |
| 2016/0041424 A1* | 2/2016 | Guo | H01L 27/3216 345/694 |
| 2016/0079333 A1* | 3/2016 | Shishido | H01L 27/3244 257/72 |
| 2016/0104413 A1* | 4/2016 | Matsueda | H01L 27/3218 345/694 |
| 2016/0126296 A1 | 5/2016 | Feng | |
| 2016/0154273 A1* | 6/2016 | Itou | G02B 5/201 359/891 |
| 2016/0203748 A1* | 7/2016 | Matsueda | H01L 27/3218 345/694 |
| 2016/0240593 A1* | 8/2016 | Gu | G09G 3/3225 |
| 2016/0322433 A1* | 11/2016 | Kim | H01L 27/3216 |
| 2017/0047382 A1* | 2/2017 | Huangfu | H01L 27/326 |
| 2017/0170200 A1* | 6/2017 | Ikeda | H01L 27/1266 |
| 2017/0294155 A1 | 10/2017 | Kim | |
| 2018/0097039 A1* | 4/2018 | Jeong | H01L 27/323 |
| 2018/0182828 A1* | 6/2018 | Kim | H01L 27/3216 |
| 2018/0308412 A1* | 10/2018 | Wu | H01L 27/3262 |
| 2019/0096962 A1 | 3/2019 | Han et al. | |
| 2019/0096971 A1* | 3/2019 | Ukigaya | H01L 27/3244 |
| 2019/0206310 A1 | 7/2019 | Tian et al. | |
| 2019/0237518 A1* | 8/2019 | Sun | H01L 27/3216 |
| 2019/0251895 A1* | 8/2019 | Zhang | G09G 3/32 |
| 2020/0035156 A1* | 1/2020 | Yanase | G09G 3/3233 |
| 2020/0043989 A1* | 2/2020 | Liu | H01L 51/56 |
| 2020/0043990 A1* | 2/2020 | Huangfu | G09G 3/3225 |
| 2020/0058713 A1* | 2/2020 | Zhang | C23C 14/24 |
| 2020/0075690 A1* | 3/2020 | Li | H01L 27/3218 |
| 2020/0075691 A1* | 3/2020 | Zhou | H01L 27/326 |
| 2020/0091250 A1* | 3/2020 | Wang | H01L 27/3244 |
| 2020/0144339 A1* | 5/2020 | He | H01L 27/3218 |
| 2020/0168674 A1* | 5/2020 | Tan | G02F 1/1333 |

FOREIGN PATENT DOCUMENTS

| | | |
|---|---|---|
| CN | 104037190 | 9/2014 |
| CN | 104332486 | 2/2015 |
| CN | 104576696 | 4/2015 |
| CN | 104659064 | 5/2015 |
| CN | 107275361 | 10/2017 |
| CN | 107731870 | 2/2018 |
| CN | 108198840 | 6/2018 |

* cited by examiner

PIXEL ARRANGEMENT STRUCTURE AND ORGANIC LIGHT-EMITTING DIODE DISPLAY DEVICE

RELATED APPLICATIONS

This application is a National Phase of PCT Patent Application No. PCT/CN2018/122461 having International filing date of Dec. 20, 2018, which claims the benefit of priority of Chinese Patent Application No. 201811343991.8 filed on Nov. 13, 2018. The contents of the above applications are all incorporated by reference as if fully set forth herein in their entirety.

FIELD AND BACKGROUND OF THE INVENTION

The present disclosure relates to a pixel arrangement, and more particularly to a pixel arrangement structure and an organic light-emitting diode display device.

Organic light-emitting diode display devices have advantages of light weight, emitting light actively, fast response speed, a large view angle, wide gamut, high brightness and low power consumption and have become developing display technologies after liquid crystal display devices. Currently, people's requirements for a resolution of a display device are high. However, manufacturing organic light-emitting diode display devices having high quality and a high resolution still faces many challenges.

In the sub-pixel rendering (SPR) technologies, adjacent pixels share a part of sub pixels to implement the increasing of a sense resolution. As such, display devices can have a higher sense resolution when the density of a sub pixel arrangement is not changed. Alternatively, a requirement for the density of a sub pixel arrangement is lowered when the sense resolution is not changed. Accordingly, the sub-pixel rendering technologies provide a scheme to solve the above-mentioned problem.

In another aspect, fine metal mask (FMM) technologies are one of key technologies of limiting the development of the organic light-emitting diode display device. With the increasing of the requirement for the resolution, it is more difficult to manufacture the fine metal masks. In the mainstream RGB stripe arrangement and the PenTile arrangement, each sub pixel corresponds to one opening of a fine metal mask. To prevent colors from being mixed, a distance between openings corresponding to sub pixels having different colors has a minimum limitation, and thus the increasing of the resolution is limited.

Consequently, there is a need to solve the above-mentioned problems in the prior art.

SUMMARY OF THE INVENTION

An objective of the present disclosure is to provide a pixel arrangement structure and an organic light-emitting diode display device capable of solving the problems in the prior art.

To solve the above problems, a pixel arrangement structure provided by the present disclosure includes a plurality of pixel rows. Two adjacent ones of the pixel rows are disposed to be misaligned with each other. Each of the pixel rows includes a plurality of pixels. Each of the pixels includes a first sub pixel; a second sub pixel; and a third sub pixel. The first sub pixel in an N+1-th pixel row is disposed adjacent to the first sub pixel of one of the pixels in an N+2-th pixel row, the second sub pixel in an N-th pixel row is disposed adjacent to the second sub pixel of one of the pixels in the N+1-th pixel row, and N is a positive odd number greater than or equal to 1. The first sub pixel in the N+1-th pixel row and the first sub pixel of the one of the pixels in the N+2-th pixel row have same color, and the second sub pixel in the N-th pixel row and the second sub pixel of the one of the pixels in the N+1-th pixel row have same color.

In one embodiment, a center of the first sub pixel, a center of the second sub pixel and a center of the third sub pixel of each of the pixels are arranged in a triangle.

In one embodiment, the first sub pixel and the second sub pixel of each of the pixels are disposed at a first side of each of the pixels, and the third sub pixel of each of the pixels is disposed at a second side of each of the pixels opposite to the first side.

In one embodiment, one of the first sub pixel and the second sub pixel of each of the pixels overlaps a center line of a long side of the third sub pixel of each of the pixels.

In one embodiment, an arrangement of the first sub pixel, the second sub pixel and the third sub pixel in odd pixel rows is different from an arrangement of the first sub pixel, the second sub pixel and the third sub pixel in even pixel rows.

To solve the above problems, a pixel arrangement structure provided by the present disclosure includes a plurality of pixel rows. Two adjacent ones of the pixel rows are disposed to be misaligned with each other. Each of the pixel rows includes a plurality of pixels. Each of the pixels includes a first sub pixel; a second sub pixel; and a third sub pixel. The first sub pixel in an N+1-th pixel row is disposed adjacent to the first sub pixel of one of the pixels in an N+2-th pixel row, the second sub pixel in an N-th pixel row is disposed adjacent to the second sub pixel of one of the pixels in the N+1-th pixel row, and N is a positive odd number greater than or equal to 1.

In one embodiment, a center of the first sub pixel, a center of the second sub pixel and a center of the third sub pixel of each of the pixels are arranged in a triangle.

In one embodiment, the first sub pixel and the second sub pixel of each of the pixels are disposed at a first side of each of the pixels, and the third sub pixel of each of the pixels is disposed at a second side of each of the pixels opposite to the first side.

In one embodiment, one of the first sub pixel and the second sub pixel of each of the pixels overlaps a center line of a long side of the third sub pixel of each of the pixels.

In one embodiment, an arrangement of the first sub pixel, the second sub pixel and the third sub pixel in odd pixel rows is different from an arrangement of the first sub pixel, the second sub pixel and the third sub pixel in even pixel rows.

An organic light-emitting diode display device provided by the present disclosure includes a pixel arrangement structure; and a driving circuit electrically coupled to the pixel arrangement structure and configured to provide scan signals and data signals for the pixel arrangement structure. The pixel arrangement structure includes a plurality of pixel rows. Two adjacent ones of the pixel rows are disposed to be misaligned with each other. Each of the pixel rows includes a plurality of pixels. Each of the pixels includes a first sub pixel; a second sub pixel; and a third sub pixel. The first sub pixel in an N+1-th pixel row is disposed adjacent to the first sub pixel of one of the pixels in an N+2-th pixel row, the second sub pixel in an N-th pixel row is disposed adjacent to the second sub pixel of one of the pixels in the N+1-th pixel row, and N is a positive odd number greater than or equal to 1.

In one embodiment, a center of the first sub pixel, a center of the second sub pixel and a center of the third sub pixel of each of the pixels are arranged in a triangle.

In one embodiment, the first sub pixel and the second sub pixel of each of the pixels are disposed at a first side of each of the pixels, and the third sub pixel of each of the pixels is disposed at a second side of each of the pixels opposite to the first side.

In one embodiment, one of the first sub pixel and the second sub pixel of each of the pixels overlaps a center line of a long side of the third sub pixel of each of the pixels.

In one embodiment, an arrangement of the first sub pixel, the second sub pixel and the third sub pixel in odd pixel rows is different from an arrangement of the first sub pixel, the second sub pixel and the third sub pixel in even pixel rows.

Compared to the prior art, in the pixel arrangement structure and the organic light-emitting diode display device, since the two first sub pixels which are disposed adjacent to each other may share one first opening of the fine metal mask, the problem of color mixing can be avoided. The resolution of the organic light-emitting diode display device can be increased when the manufacturing process is not changed. Alternatively, the difficulty of the manufacturing process can be decreased when the resolution is not changed. Furthermore, since the two second sub pixels which are disposed adjacent to each other may share one second opening of the fine metal mask, the problem of color mixing can be avoided. The resolution of the organic light-emitting diode display device can be increased when the manufacturing process is not changed. Alternatively, the difficulty of the manufacturing process can be decreased when the resolution is not changed. Moreover, a number of the sub pixels in the pixel arrangement structure of the present disclosure can be decreased, when compared to the RGB stripe arrangement in the prior art.

DESCRIPTION OF SPECIFIC EMBODIMENTS OF THE INVENTION

Hereinafter, exemplary embodiments of the present disclosure will be described with reference to the accompanying drawings for illustrating specific embodiments which can be carried out by the present disclosure.

Figure 1:
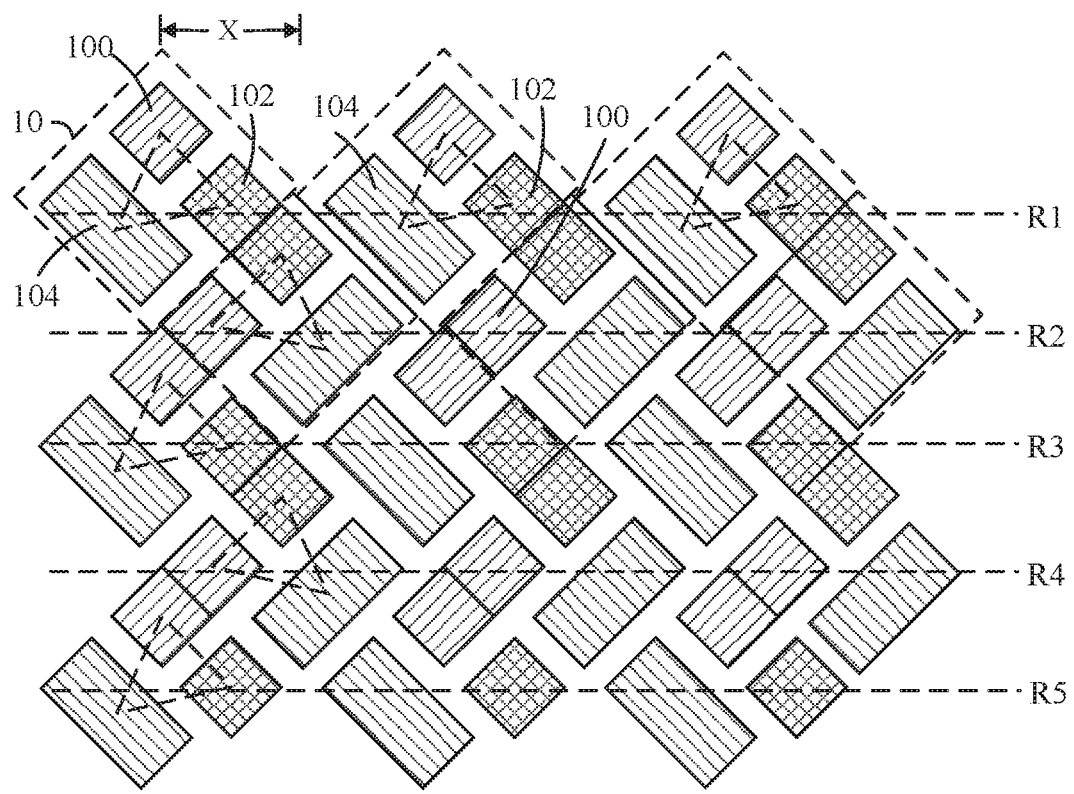
FIG. 1 illustrates a pixel arrangement structure of an organic light-emitting diode display device in accordance with an embodiment of the present disclosure.
Figure 2:
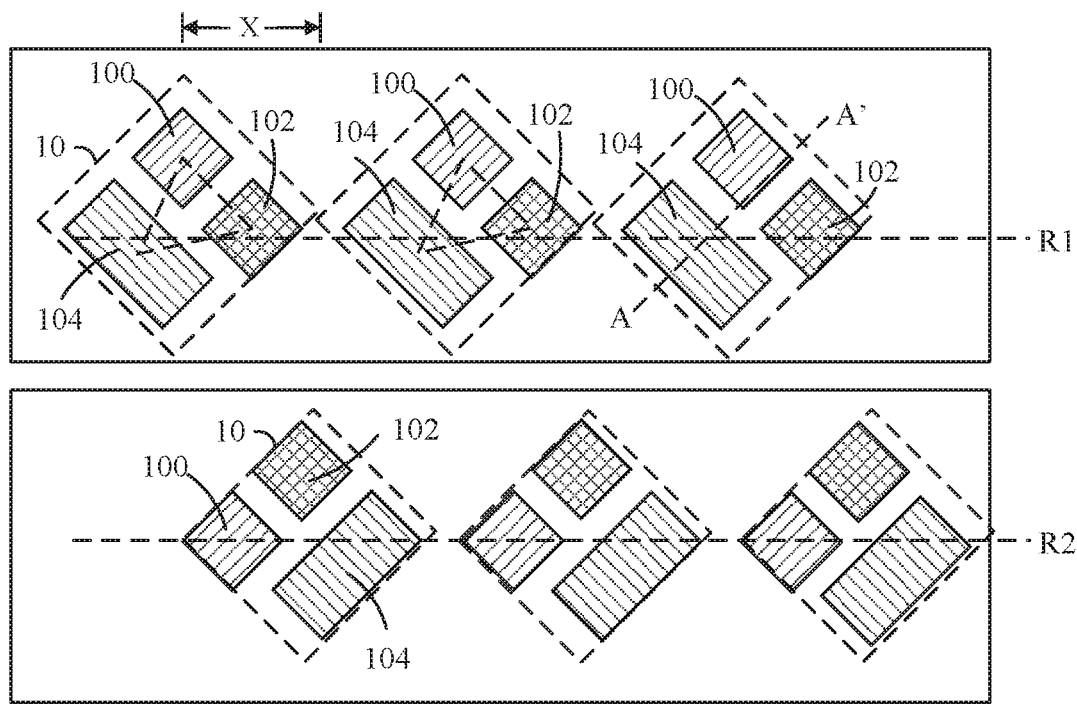
FIG. 2 illustrates a pixel row R1 and a pixel row R2 in FIG. 1.

Please refer to FIG. 1 and FIG. 2. FIG. 1 illustrates a pixel arrangement structure of an organic light-emitting diode display device in accordance with an embodiment of the present disclosure. FIG. 2 illustrates a pixel row R1 and a pixel row R2 in FIG. 1.

The organic light-emitting diode display device includes a plurality of pixel rows R1-R5. Each of the pixel rows R1-R5 includes a plurality of pixels 10. Each of the pixels 10 includes a first sub pixel 100, a second sub pixel 102 and a third sub pixel 104.

The first sub pixel 100, the second sub pixel 102 and the third sub pixel 104 may be any one of a red sub pixel, a green sub pixel and a blue sub pixel. The first sub pixel 100, the second sub pixel 102 and the third sub pixel 104 have different colors.

A center of the first sub pixel 100, a center of the second sub pixel 102 and a center of the third sub pixel 104 of each of the pixels 10 are arranged in a triangle.

In the present embodiment, two adjacent ones of the pixel rows R1-R5 are disposed to be misaligned with each other. In detail, even pixel rows including the pixel rows R2 and R4 are shifted by a distance X in a horizontal direction with respect to odd pixel rows including the pixel rows R1, R3 and R5. The distance X may be designed adequately according to requirements.

The first sub pixel 100 of each of the pixels 10 is disposed adjacent to the first sub pixel 100 of one of the pixels 10 in an adjacent one of the pixel rows R1-R5, and/or the second sub pixel 102 of each of the pixels 10 is disposed adjacent to the second sub pixel 102 of one of the pixels 10 in an adjacent one of the pixel rows R1-R5.

That is, the second sub pixel 102 in the pixel row R1 is disposed adjacent to the second sub pixel 102 of one of the pixels 10 in the pixel row R2 (an adjacent pixel row of the pixel row R1). The second sub pixel 102 in the pixel row R3 is disposed adjacent to the second sub pixel 102 of one of the pixels 10 in the pixel row R4 (an adjacent pixel row of the pixel row R3). It can be understood form the above that the second sub pixel 102 in an N-th pixel row is disposed adjacent to the second sub pixel 102 of one of the pixels 10 in an N+1-th pixel row (an adjacent pixel row of the N-th pixel row). N is a positive odd number greater than or equal to 1.

The first sub pixel 100 in the pixel row R2 is disposed adjacent to the first sub pixel 100 of one of the pixels 10 in the pixel row R3 (an adjacent pixel row of the pixel row R2). The first sub pixel 100 in the pixel row R4 is disposed adjacent to the first sub pixel 100 of one of the pixels 10 in the pixel row R5 (an adjacent pixel row of the pixel row R4). It can be understood form the above that the first sub pixel 100 in the N+1-th pixel row is disposed adjacent to the first sub pixel 100 of one of the pixels 10 in an N+2-th pixel row (an adjacent pixel row of the N-th+1 pixel row).

The two first sub pixels 100 which are disposed adjacent to each other may share one first opening of a fine metal mask in an evaporation process. That is, a shape and an area of the two first sub pixels 100 which are disposed adjacent to each other correspond to a shape and area of one first opening of the fine metal mask.

The two second sub pixels 102 which are disposed adjacent to each other may share one second opening of a fine metal mask in an evaporation process. That is, a shape and an area of the two second sub pixels 102 which are disposed adjacent to each other correspond to a shape and area of one second opening of the fine metal mask.

Since the two first sub pixels 100 (i.e., having the same color) which are disposed adjacent to each other may share one first opening of the fine metal mask, the problem of color mixing can be avoided. A resolution of the organic light-emitting diode display device can be increased when a manufacturing process is not changed. Alternatively, difficulty of the manufacturing process can be decreased when the resolution is not changed. Furthermore, since the two second sub pixels 102 (i.e., having the same color) which are disposed adjacent to each other may share one second opening of the fine metal mask, the problem of color mixing can be avoided. The resolution of the organic light-emitting diode display device can be increased when the manufacturing process is not changed. Alternatively, the difficulty of the manufacturing process can be decreased when the resolution is not changed.

A shape and an area of the third second sub pixel 104 correspond to a shape and area of one third opening of the fine metal mask.

The two first sub pixels 100 which are disposed adjacent to each other may be driven by two driving circuits or may be driven by one driving circuit. The two second sub pixels 102 which are disposed adjacent to each other may be driven by two driving circuits or may be driven by one driving circuit.

Furthermore, the first sub pixel 100 and the second sub pixel 102 of each of the pixels 10 are disposed at a first side of each of the pixels 10. The third sub pixel 104 of each of the pixels 10 is disposed at a second side of each of the pixels 10 opposite to the first side.

One of the first sub pixel 100 and the second sub pixel 102 of each of the pixels 10 overlaps a center line AA' (in FIG. 2) of a long side of the third sub pixel 104 of each of the pixels 10.

Furthermore, an arrangement of the first sub pixel 100, the second sub pixel 102 and the third sub pixel 104 in the odd pixel rows including the pixel rows R1, R3 and R5 is different from an arrangement of the first sub pixel 100, the second sub pixel 102 and the third sub pixel 104 in the even pixel rows including the pixel rows R2 and R4. For example, the arrangement of the first sub pixel 100, the second sub pixel 102 and the third sub pixel 104 in the even pixel rows including the pixel rows R2 and R4 may be the same as the arrangement of the first sub pixel 100, the second sub pixel 102 and the third sub pixel 104 in the odd pixel rows including the pixel rows R1, R3 and R5 by counterclockwise rotating the arrangement of the first sub pixel 100, the second sub pixel 102 and the third sub pixel 104 in the odd pixel rows including the pixel rows R1, R3 and R5 by an angle. The angle may be one angle greater than 0 degree and smaller than 180 degrees.

Figure 3:
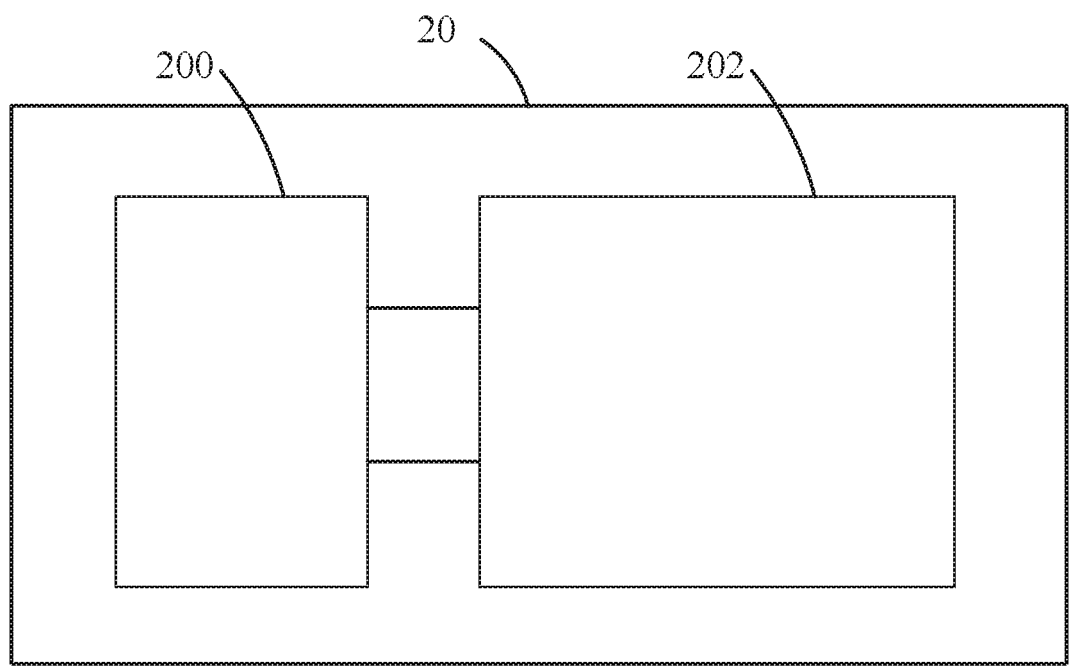
FIG. 3 illustrates an organic light-emitting diode display device in accordance with an embodiment of the present disclosure.

Please refer to FIG. 3. FIG. 3 illustrates an organic light-emitting diode display device 20 in accordance with an embodiment of the present disclosure.

The organic light-emitting diode display device 20 includes a driving circuit 200 and the pixel arrangement structure 202 as shown in FIG. 1.

The driving circuit 200 is electrically coupled to the pixel arrangement structure 202 and may include a scan driving circuit and a data driving circuit. The driving circuit 200 is configured to provide scan signals (the scan driving circuit) for the pixel arrangement structure 202 and is configured to provide data signals (the data driving circuit) for the pixel arrangement structure 202.

In the pixel arrangement structure and the organic light-emitting diode display device, since the two first sub pixels which are disposed adjacent to each other may share one first opening of the fine metal mask, the problem of color mixing can be avoided. The resolution of the organic light-emitting diode display device can be increased when the manufacturing process is not changed. Alternatively, the difficulty of the manufacturing process can be decreased when the resolution is not changed. Furthermore, since the two second sub pixels which are disposed adjacent to each other may share one second opening of the fine metal mask, the problem of color mixing can be avoided. The resolution of the organic light-emitting diode display device can be increased when the manufacturing process is not changed. Alternatively, the difficulty of the manufacturing process can be decreased when the resolution is not changed. Moreover, a number of the sub pixels in the pixel arrangement structure of the present disclosure can be decreased, when compared to the RGB stripe arrangement in the prior art.

In summary, although the present disclosure has been provided in the preferred embodiments described above, the foregoing preferred embodiments are not intended to limit the present disclosure. Those skilled in the art, without departing from the spirit and scope of the present disclosure, may make modifications and variations, so the scope of the protection of the present disclosure is defined by the claims.

What is claimed is:

1. A pixel arrangement structure, comprising a plurality of pixel rows, two adjacent ones of the pixel rows disposed to be misaligned with each other, each of the pixel rows comprising a plurality of pixels, each of the pixels comprising:
   a first sub pixel;
   a second sub pixel; and
   a third sub pixel,
   wherein the first sub pixel in an N+1-th pixel row is disposed adjacent to the first sub pixel of one of the pixels in an N+2-th pixel row, the second sub pixel in an N-th pixel row is disposed adjacent to the second sub pixel of one of the pixels in the N+1-th pixel row, and N is a positive odd number greater than or equal to 1,
   wherein the first sub pixel in the N+1-th pixel row and the first sub pixel of the one of the pixels in the N+2-th pixel row have same color, and the second sub pixel in the N-th pixel row and the second sub pixel of the one of the pixels in the N+1-th pixel row have same color,
   wherein an arrangement of the first sub pixel, the second sub pixel and the third sub pixel in even pixel rows is the same as an arrangement of the first sub pixel, the second sub pixel and the third sub pixel in odd pixel rows by counterclockwise rotating the arrangement of the first sub pixel, the second sub pixel and the third sub pixel in the odd pixel rows by an angle, and the angle is one angle greater than 0 degree and smaller than 180 degrees.

2. The pixel arrangement structure of claim 1, wherein a center of the first sub pixel, a center of the second sub pixel and a center of the third sub pixel of each of the pixels are arranged in a triangle.

3. The pixel arrangement structure of claim 1, wherein the first sub pixel and the second sub pixel of each of the pixels are disposed at a first side of each of the pixels, and the third sub pixel of each of the pixels is disposed at a second side of each of the pixels opposite to the first side.

4. The pixel arrangement structure of claim 3, wherein one of the first sub pixel and the second sub pixel of each of the pixels overlaps a center line of a long side of the third sub pixel of each of the pixels.

5. The pixel arrangement structure of claim 4, wherein the arrangement of the first sub pixel, the second sub pixel and the third sub pixel in the odd pixel rows is different from the arrangement of the first sub pixel, the second sub pixel and the third sub pixel in the even pixel rows.

6. A pixel arrangement structure, comprising a plurality of pixel rows, two adjacent ones of the pixel rows disposed to be misaligned with each other, each of the pixel rows comprising a plurality of pixels, each of the pixels comprising:
   a first sub pixel;
   a second sub pixel; and
   a third sub pixel,
   wherein the first sub pixel in an N+1-th pixel row is disposed adjacent to the first sub pixel of one of the pixels in an N+2-th pixel row, the second sub pixel in an N-th pixel row is disposed adjacent to the second sub pixel of one of the pixels in the N+1-th pixel row, and N is a positive odd number greater than or equal to 1, wherein an arrangement of the first sub pixel, the second sub pixel and the third sub pixel in even pixel rows is the same as an arrangement of the first sub pixel, the second sub pixel and the third sub pixel in odd pixel rows by counterclockwise rotating the arrangement of the first sub pixel, the second sub pixel and the third sub pixel in the odd pixel rows by an angle, and the angle is one angle greater than 0 degree and smaller than 180 degrees.

7. The pixel arrangement structure of claim 6, wherein a center of the first sub pixel, a center of the second sub pixel and a center of the third sub pixel of each of the pixels are arranged in a triangle.

8. The pixel arrangement structure of claim 6, wherein the first sub pixel and the second sub pixel of each of the pixels are disposed at a first side of each of the pixels, and the third sub pixel of each of the pixels is disposed at a second side of each of the pixels opposite to the first side.

9. The pixel arrangement structure of claim 8, wherein one of the first sub pixel and the second sub pixel of each of the pixels overlaps a center line of a long side of the third sub pixel of each of the pixels.

10. The pixel arrangement structure of claim 9, wherein the arrangement of the first sub pixel, the second sub pixel and the third sub pixel in the odd pixel rows is different from the arrangement of the first sub pixel, the second sub pixel and the third sub pixel in the even pixel rows.

11. An organic light-emitting diode display device, comprising:
a pixel arrangement structure; and
a driving circuit electrically coupled to the pixel arrangement structure and configured to provide scan signals and data signals for the pixel arrangement structure,
the pixel arrangement structure comprising a plurality of pixel rows, two adjacent ones of the pixel rows disposed to be misaligned with each other, each of the pixel rows comprising a plurality of pixels, each of the pixels comprising:

a first sub pixel;

a second sub pixel; and a third sub pixel, wherein the first sub pixel in an N+1-th pixel row is disposed adjacent to the first sub pixel of one of the pixels in an N+2-th pixel row, the second sub pixel in an N-th pixel row is disposed adjacent to the second sub pixel of one of the pixels in the N+1-th pixel row, and N is a positive odd number greater than or equal to 1, wherein an arrangement of the first sub pixel, the second sub pixel and the third sub pixel in even pixel rows is the same as an arrangement of the first sub pixel, the second sub pixel and the third sub pixel in odd pixel rows by counterclockwise rotating the arrangement of the first sub pixel, the second sub pixel and the third sub pixel in the odd pixel rows by an angle, and the angle is one angle greater than 0 degree and smaller than 180 degrees.

12. The organic light-emitting diode display device of claim 11, wherein a center of the first sub pixel, a center of the second sub pixel and a center of the third sub pixel of each of the pixels are arranged in a triangle.

13. The organic light-emitting diode display device of claim 11, wherein the first sub pixel and the second sub pixel of each of the pixels are disposed at a first side of each of the pixels, and the third sub pixel of each of the pixels is disposed at a second side of each of the pixels opposite to the first side.

14. The organic light-emitting diode display device of claim 13, wherein one of the first sub pixel and the second sub pixel of each of the pixels overlaps a center line of a long side of the third sub pixel of each of the pixels.

15. The organic light-emitting diode display device of claim 14, wherein the arrangement of the first sub pixel, the second sub pixel and the third sub pixel in the odd pixel rows is different from the arrangement of the first sub pixel, the second sub pixel and the third sub pixel in the even pixel rows.

* * * * *